United States Patent
Takaishi

(10) Patent No.: US 7,276,434 B2
(45) Date of Patent: Oct. 2, 2007

(54) METHOD FOR FILLING A CONTACT HOLE HAVING A SMALL DIAMETER AND A LARGE ASPECT RATIO

(75) Inventor: Masaru Takaishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 138 days.

(21) Appl. No.: 10/766,212

(22) Filed: Jan. 29, 2004

(65) Prior Publication Data

US 2004/0185660 A1 Sep. 23, 2004

(30) Foreign Application Priority Data

Feb. 27, 2003 (JP) ............... 2003-051571

(51) Int. Cl.
 *H01L 21/44* (2006.01)
(52) U.S. Cl. ............ 438/597; 438/672; 438/675; 438/688; 257/E21.584; 257/E21.585
(58) Field of Classification Search ............ 438/597, 438/660, 669, 672, 674, 675, 688, 668
See application file for complete search history.

(56) References Cited

U.S. PATENT DOCUMENTS 4,538,344 A 9/1985 Okumura et al.
5,621,247 A * 4/1997 Hirao et al. ............ 257/763
6,143,645 A * 11/2000 Hsu et al. .............. 438/627

FOREIGN PATENT DOCUMENTS

| JP | 59-154040 | 9/1984 |
|---|---|---|
| JP | 02-116124 | 4/1990 |
| JP | 05-013594 | 1/1993 |
| JP | 2003-303785 | 10/2003 |

\* cited by examiner

*Primary Examiner*—Fernando L. Toledo
(74) *Attorney, Agent, or Firm*—Rabin & Berdo, PC

(57) ABSTRACT

A method for manufacturing a semiconductor device having a semiconductor substrate with a contact hole filled by an aluminum-containing thin film. This manufacturing method includes a step of forming a silicon-containing thin film in a region having a predetermined area including the inner surface of the contact hole on the surface of the semiconductor substrate, an step of forming an aluminum-containing thin film on the surface of the semiconductor substrate on which the silicon-containing thin film is formed, and a step of heating the semiconductor substrate on which the aluminum-containing thin film is formed to such a temperature as to cause silicon to diffuse with respect to aluminum.

8 Claims, 3 Drawing Sheets

METHOD FOR FILLING A CONTACT HOLE HAVING A SMALL DIAMETER AND A LARGE ASPECT RATIO

BACKGROUND OF THE INVENTION

1. Field of the Invention

The present invention relates to a method for manufacturing a semiconductor device such as a MOS FET, and especially to a method for manufacturing a semiconductor device including a step of forming an aluminum-containing thin film so as to fill a minute contact hole formed on a semiconductor substrate such as a silicon substrate.

2. Description of Related Art

In the process of manufacturing a semiconductor device, an electrode thin film of aluminum is formed so as to fill therewith a hole-shaped or trench-shaped minute contact hole formed in a semiconductor substrate. Such an electrode thin film functions as a deriving electrode of a device (for example, transistor) formed on the silicon substrate.

Such a thin film has been heretofore formed by supplying aluminum atoms on a silicon substrate using a sputtering method and forming an aluminum thin film so as to fill a contact hole therewith. In some cases, in the step of forming the aluminum thin film, the silicon substrate has been heated so that the contact hole can be easily filled with the aluminum thin film.

However, in keeping with wiring patterns recently becoming minute, the width and the diameter of a contact hole have become smaller (for example, not more than 0.6 μm). On the other hand, the depth of a contact hole has not changed even if wiring patterns have become minute. Therefore, the ratio of the depth of a contact hole to the width or the diameter of the contact hole (aspect ratio) becomes large (for example, not less than 1).

An aluminum thin film capable of suitably filling such a contact hole having a small width or diameter and a large aspect ratio cannot be formed by the abovementioned conventional method. In concrete, there is a problem that a void (air gap) is formed in a portion of an aluminum thin film corresponding to the contact hole. It occurs because, by using sputtering method, the aluminum thin film grows to close the opening of the contact hole before the inner space of the contact hole having a small width or diameter and a large aspect ratio is completely filled with aluminum atoms.

Further, there is another problem that in the step of forming an aluminum thin film or the following steps, aluminum atoms diffuse in diffusion regions or the like on the silicon substrate (aluminum spike) and thereby the p-n junction of a device is destructed.

SUMMARY OF THE INVENTION

An object of the present invention is to provide a method for manufacturing a semiconductor device capable of suitably filling an aluminum-containing thin film into a contact hole having a small width or diameter and a large aspect ratio formed on a semiconductor substrate.

Another object of the present invention is to provide a method for manufacturing a semiconductor device in which aluminum atoms are hard to diffuse from an aluminum-containing thin film filled into a contact hole.

A method for manufacturing a semiconductor device according to the present invention is a method for manufacturing a semiconductor device having a semiconductor substrate with a contact hole filled by an aluminum-containing thin film. This method for manufacturing a semiconductor device includes a step of forming a silicon-containing thin film in a region having a predetermined area including the inner surface of the contact hole on the surface of the semiconductor substrate, a step of forming an aluminum-containing thin film on the surface of the semiconductor substrate on which the silicon-containing thin film is formed, and a step of heating the semiconductor substrate on which the aluminum-containing thin film is formed to such a temperature as to cause silicon to diffuse with respect to aluminum.

According to the present invention, prior to forming an aluminum-containing thin film (hereinafter referred to as "aluminum thin film"), a silicon-containing thin film is formed in a region including the inner surface of a contact hole. In case that the silicon-containing thin film is formed to fill the contact hole, aluminum atoms supplied onto the surface of the semiconductor substrate, for example, by physical vapor deposition method in the following step of forming the aluminum thin film are also supplied onto the silicon-containing thin film filled in the contact hole. Further, in case that the silicon-containing thin film is formed without filling the contact hole, aluminum atoms are hard to reach the inner portion (especially the inner wall) of the contact hole in the following step of forming the aluminum thin film.

In either case, in the step of heating the semiconductor substrate, silicon atoms constituting the silicon-containing thin film in the contact hole diffuse in the aluminum thin film, and aluminum atoms constituting the aluminum thin film also diffuse in the silicon-containing thin film in the contact hole to move into the contact hole.

As a result, the contact hole can be suitably filled with the aluminum thin film. Especially when the width or the diameter of the contact hole is as small as not more than 0.6 μm and the aspect ratio of the contact hole is as high as not less than 1, such a manufacturing method is effective. Unnecessary portions of the aluminum thin film may be thereafter removed away by etching or the like. The aluminum thin film suitably filled into the contact hole can be obtained in such a manner.

The contact hole may be one for connecting a deriving electrode to a device formed on the surface of the semiconductor substrate or one for effecting inter-layer connection of multi-layer wirings. By the abovementioned method, for example, a semiconductor layer (possible to be the semiconductor substrate itself) or wirings exposed to the inside of the contact hole can be electrically connected to the aluminum thin film.

The step of heating the semiconductor substrate may be carried out at the same time with the step of forming the aluminum thin film or after completing the step of forming the aluminum thin film. Further, it is possible to carry out the step of heating the semiconductor substrate at the same time with the step of forming the aluminum thin film and in addition continue the step of heating the semiconductor substrate for a predetermined time after completing the step of forming the aluminum thin film.

Furthermore, since the aluminum thin film becomes to contain silicon, aluminum atoms in the aluminum thin film filled into the contact hole are hard to diffuse in the semiconductor layer (especially one formed of silicon). As a result, p-n junction formed in the inner portion of the semiconductor layer can be prevented from being destructed.

The amount of silicon necessary for obtaining such an effect is as small as, for example, not more than a few percent by atomic ratio to the amount of aluminum in the aluminum thin film. Therefore, if silicon is supplied throughout the whole surface of the semiconductor substrate in order to form a silicon-containing thin film, the amount of silicon supplied to a unit area becomes small, so that it becomes difficult to accurately control the amount of silicon.

According to the present invention, if the region having a predetermined area to be supplied with silicon is small, a large amount of silicon can be supplied to this region having the predetermined area. Therefore, it is possible to accurately control the amount of silicon in the silicon-containing thin film.

The abovementioned predetermined area can be, for example, smaller than the area of the aluminum thin film formed in the step of forming the aluminum thin film. "The area of the aluminum thin film" here means the area of the region on which the aluminum thin film is formed on the semiconductor substrate as a base.

The semiconductor substrate may be, for example, a silicon substrate or a substrate on which an epitaxial layer is formed.

The step of forming a silicon-containing thin film may include a step of forming a polysilicon thin film by chemical vapor deposition method. A polysilicon film can be suitably formed in a contact hole by chemical vapor deposition method. The step of forming the aluminum thin film may include a step of forming an aluminum thin film by sputtering method which is an example of physical vapor deposition method.

The step of forming the silicon-containing thin film in the region having the predetermined area may includes a step of forming a silicon-containing thin film in a region larger than the predetermined area and a step of removing the silicon-containing thin film so that the area of the silicon-containing thin film can become the abovementioned predetermined area.

By this method, the area of the silicon-containing thin film can become accurately equal to the predetermined area, for example, by a step of removing the silicon-containing thin film using a mask having a predetermined pattern.

The step of forming a silicon-containing thin film in a region larger than the predetermined area may be a step of forming a silicon-containing thin film throughout the whole surface of the semiconductor substrate in which the contact hole is formed. The step of removing the silicon-containing thin film may include a step of removing the silicon-containing thin film by etching.

The abovementioned predetermined area may be not more than 99% of the area of the aluminum thin film formed in the step of forming the aluminum thin film.

By selecting the ratio of the predetermined area on which the silicon-containing thin film is formed to the area of the aluminum thin film as abovementioned, the accuracy of the silicon amount with respect to the amount of aluminum in the aluminum thin film can be increased. As the ratio of the abovementioned predetermined area to the area of the aluminum thin film becomes smaller, the accuracy of the silicon amount with respect to the amount of aluminum in the aluminum thin film can be more increased.

The abovementioned semiconductor substrate may be provided with a plurality of cells each including such a contact hole. In this case, the ratio of the amount of silicon contained in the silicon-containing thin film formed in the region having the predetermined area per unit cell to aluminum supplied to a unit cell in the step of forming the aluminum thin film may be not less than 0.1% and not more than 2% by atomic ratio.

Thereby, the abovementioned movement of aluminum atoms effectively occurs by diffusion, so that the contact hole can be suitably filled with the aluminum electrode film. Further, formation of silicon nodules due to excessive silicon can be prevented. The atomic ratio of silicon contained in the silicon-containing thin film to aluminum has to be within the abovementioned range only after completing the step of removing the silicon-containing thin film, and it may be of a larger value immediately after the silicon-containing thin film is formed.

In such a manner, even if the amount of silicon in the silicon-containing thin film with respect to the amount of aluminum contained in the aluminum thin film is small, the amount of silicon supplied to the region having the predetermined area can become large. Therefore, the amount of silicon in the silicon-containing thin film can be accurately controlled.

The abovementioned step of heating the semiconductor substrate may includes a step of heating the semiconductor substrate to 380° C.~570° C.

By heating the semiconductor substrate to a temperature not lower than 380° C. in the step of heating the semiconductor substrate, aluminum atoms and silicon atoms can suitably diffuse as abovementioned, so that the aluminum thin film can be suitably filled into the contact hole.

Further, by selecting the heating temperature of the semiconductor substrate not higher than 570° C., the amount of aluminum atoms diffusing from the aluminum thin film filled into the contact hole into the semiconductor substrate and the like can be reduced.

The abovementioned and other objects, features and advantages of the present invention will become more apparent from the following description of preferred embodiments given with reference to the appended drawings.

DESCRIPTION OF THE PREFERRED EMBODIMENTS

Figure 1:
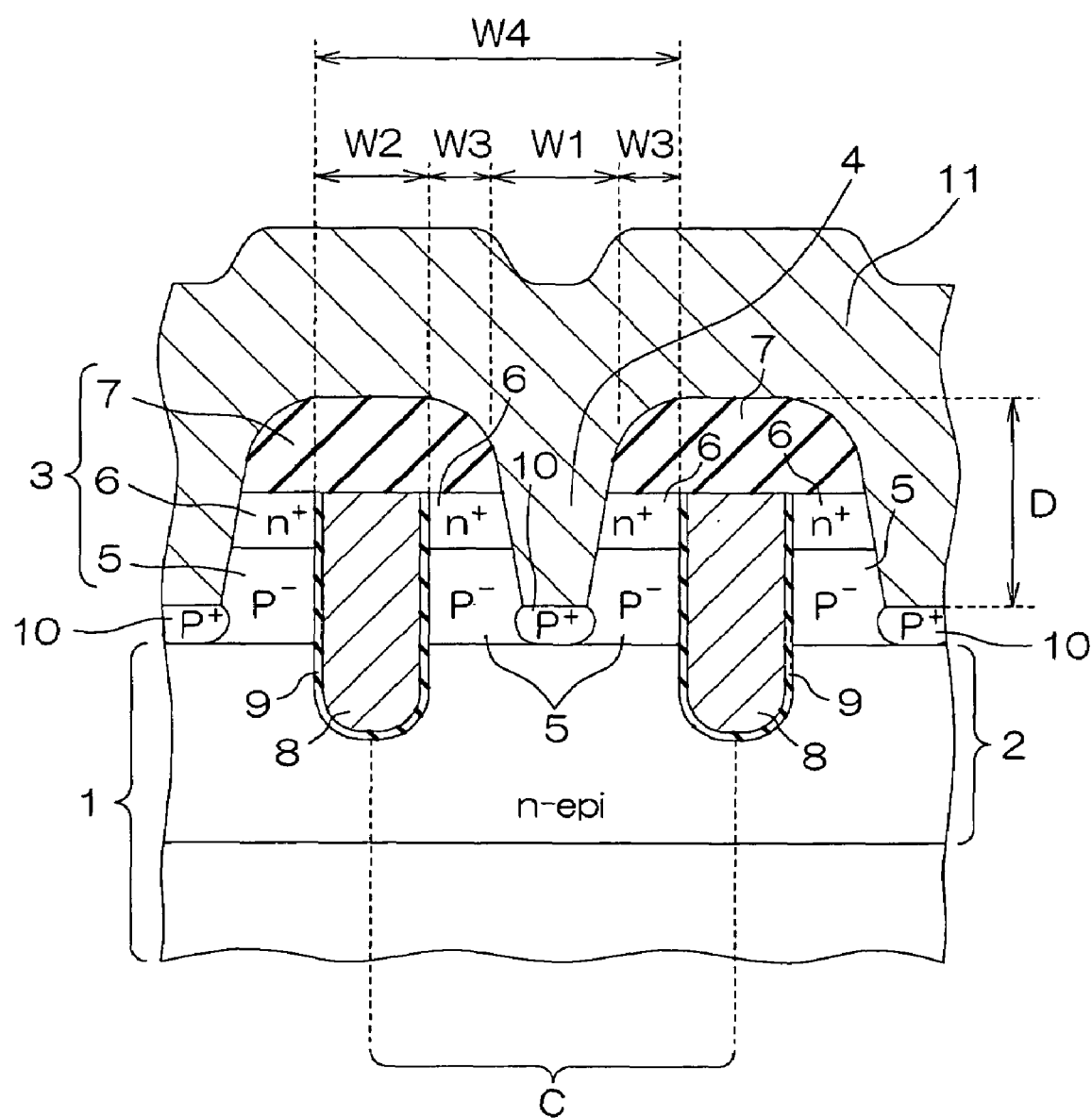
FIG. 1 is a schematic sectional view showing a structure of a MOS FET manufactured by the method according to the present invention.

FIG. 1 is a schematic sectional view showing a structure of a MOS FET (Metal Oxide Semiconductor Field Effect Transistor) manufactured by the method according to the present invention.

An n⁻-type epitaxial layer 2 is formed on the surface of a silicon substrate 1. A plurality of ridge-shaped stacked layers 3 are formed on the epitaxial layer 2. The staked layers 3 include ones extended in a first direction along the surface of the silicon substrate 1 (the direction perpendicular to the paper surface in FIG. 1) and ones extended in a second direction along the surface of the silicon substrate 1 and perpendicular to the first direction (in parallel to the paper surface in FIG. 1). A plurality of stacked layers 3 are arranged substantially in parallel to each other with respect to the respective directions. In other words, the stacked layers 3 are formed in a grid-like arrangement. The region surrounded by the stacked layers 3 constitutes a contact hole 4. The contact hole 4 has a depth not reaching the epitaxial layer 2.

The stacked layer 3 includes a p⁻-layer 5, an n⁺-layer 6 and a silicon oxide layer 7 stacked from the lower portion (the epitaxial layer 2 side) to the upper portion. A polysilicon film 8 is formed to extend from the upper portion of the epitaxial layer 2 into the stacked layer 3. The polysilicon film 8 penetrates the p⁻-layer 5 and the n⁺-layer 6 and is in contact with the silicon oxide layer 7 at its upper side (the side opposite to the epitaxial layer 2 side). The polysilicon film 8 has been made conductive by adding impurities thereto, and externally connected at the end portion of the silicon substrate 1 so as to serve as a gate electrode of the FET.

An oxide layer (gate oxide layer) 9 is formed surrounding the polysilicon film 8 except the portion in contact with the silicon oxide layer 7.

At the bottom of the contact hole 4, a p⁺-layer 10 having a smaller thickness than that of the p⁻-layer 5 is formed in contact with the epitaxial layer 2 and between the p⁻-layers 5 of the adjacent stacked layers 3. On the stacked layers 3 and the p⁺-layer 10, an aluminum electrode film 11 containing aluminum (Al) as the main component is formed so as to fill the contact hole 4. The aluminum electrode film 11 contains a small amount (for example, 0.3% of the aluminum by atomic ratio) of silicon. The aluminum electrode film 11 functions as a deriving electrode of the n⁺-layer 6.

By applying a predetermined voltage between the aluminum electrode film 11 and an unshown electrode connected to the silicon substrate 1 and making the polysilicon film 8 (gate electrode) at a predetermined potential, a current (drain current) can flow between the n⁺-layer 6 and the epitaxial layer 2 through the p⁻-layers 5. In the p⁻-layers 5, the drain current flows in the vicinity of and along the oxide layer 9. Therefore, a channel is formed in the vicinity of the oxide layer 9 in the p⁻-layer 5.

In the MOS FET having such a structure as abovementioned, the width W1 of the contact hole 4 is, for example, 0.6 μm, and the ratio (aspect ratio) D/W1 of the depth D of the contact hole 4 to the width W1 thereof is large (for example, not less than 1). The width W2 of the polysilicon film 8 is, for example, 0.6 μm, and the width W3 of the part of the stacked layer 3 on one side of the polysilicon film 8 is, for example, 0.45 μm. Therefore, the width W4 of a device unit (cell C) of this MOS FET is, for example, 2.1 μm. Since the channel is formed in the vertical direction (in the direction perpendicular to the silicon substrate 1) and in addition, the n⁺-layer 6 and the aluminum electrode film 11 are in contact with each other on the inner wall of the contact hole 4, such a small cell C can be realized.

Figure 2A:
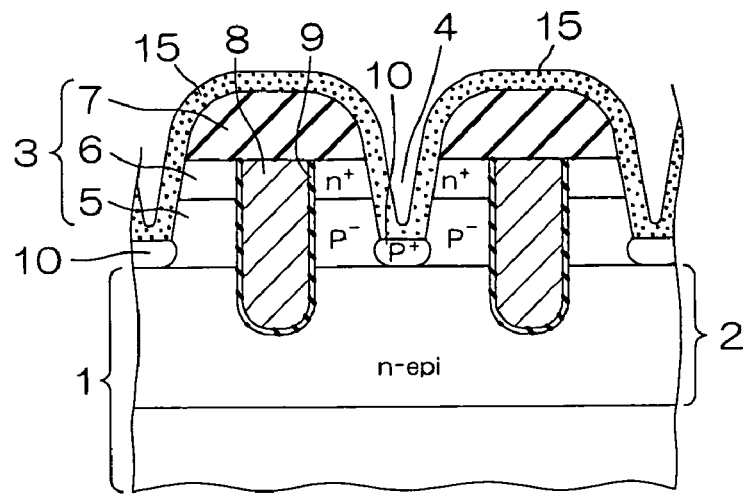
FIGS. 2(a), 2(b) and 2(c) are schematic sectional views for explaining a method for forming an aluminum electrode film.
Figure 2B:
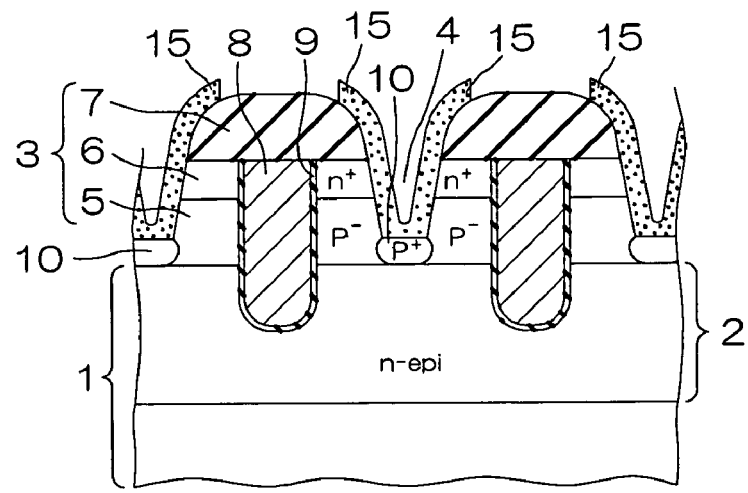
Figure 2C:
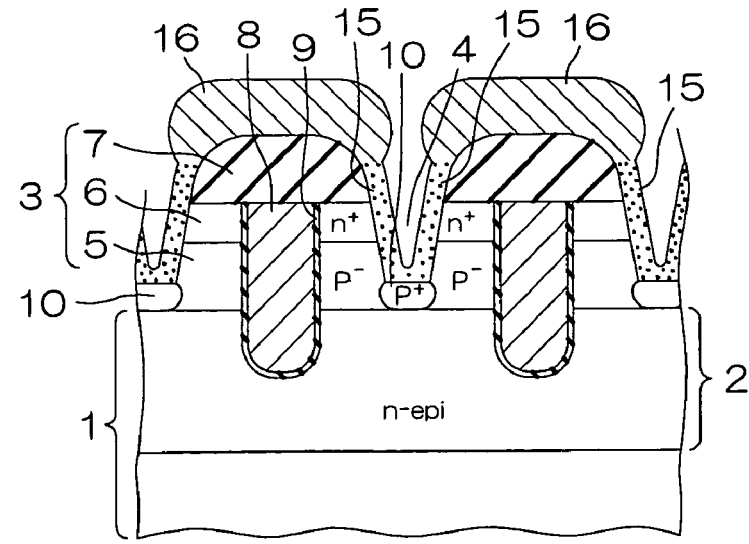

By making a cell C so small, a large number of cells C can be obtained in a unit area. Thereby, the number of the channels per unit area and regions in the epitaxial layer 2 in which the current flows can be increased. As a result, ON-state resistance can be reduced. FIGS. 2(a), 2(b) and 2(c) are schematic sectional views for explaining a step of forming an aluminum electrode film 11.

Firstly, a polysilicon film 15 is formed on the p⁺-layer 10 and the stacked layer 3 substantially throughout the whole surface of the silicon substrate 1 by CVD (chemical vapor deposition) method (see FIG. 2(a)). The polysilicon film 15 is formed with a uniform thickness on the side surface of the stacked layer 3 (inner wall of the contact hole 4), the upper surface of the stacked layer 3, the upper surface of the p⁺-layer 10 and the like. The thickness of the polysilicon film 15 can be, for example, 1000 Å.

Next, a mask having openings of a predetermined pattern is formed on the surface of the polysilicon film 15. The mask is formed so as to cover the contact hole 4 and the vicinity thereof, and a region corresponding to the top portion of the silicon oxide layer 7 is exposed from the opening of the mask. Then, by etching through the opening of the mask, the polysilicon film 15 is removed. Thereby, the polysilicon film 15 exists only in a region including the inner wall of the contact hole 4 with having a predetermined area. Such a state is shown in FIG. 2(b).

Figure 3:
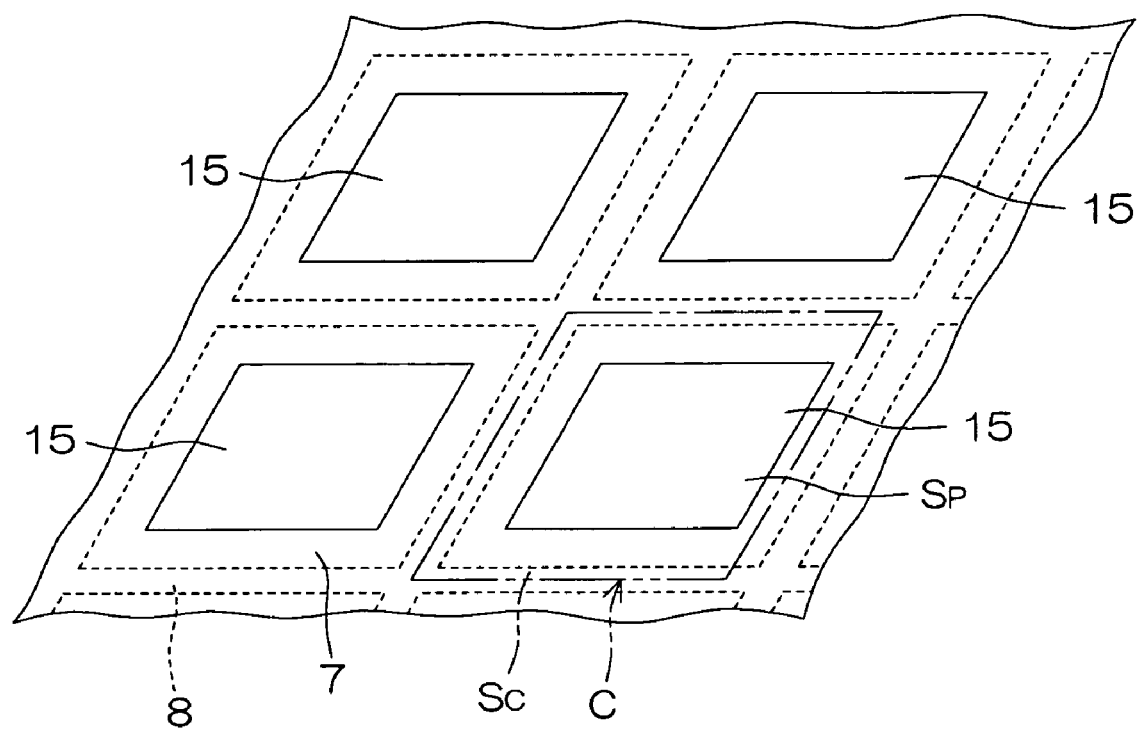
FIG. 3 is a schematic perspective view showing the distribution of polysilicon film after etching.

FIG. 3 is a schematic perspective view showing the distribution of polysilicon film 15 after etching. Square regions of the polysilicon film 15 each having a predetermined area in plan view are left. A part of the silicon oxide layer 7 is exposed from the polysilicon film 15.

Referring now to FIGS. 2(b) and 2(c), aluminum atoms are deposited by sputtering method to form an aluminum thin film 16 substantially on the whole surface of the silicon substrate 1 on which the polysilicon film 15 is formed in the regions each having a predetermined area. At this time, the silicon substrate 1 is heated. The heating temperature is 380° C.~570° C.

Since aluminum atoms supplied onto the silicon substrate 1 by sputtering method are hard to reach the inner portion of the contact hole 4, aluminum atoms are deposited mainly outside the contact hole 4 to form the aluminum thin film 16 at the beginning of the thin film formation. Aluminum atoms diffuse in the polysilicon film 15 within the above-mentioned temperature range, and therefore a part of the aluminum thin film 16 formed outside the contact hole 4 moves so as to flow into the contact hole 4.

Further, silicon atoms constituting the polysilicon film 15 also diffuse in the aluminum thin film 16. In such a manner, the contact hole 4 is gradually filled with the aluminum thin film 16 (see FIG. 2(c)), and at the end of the thin film formation, the contact hole 4 is wholly filled with the aluminum thin film 16. It is possible to continue heating the silicon substrate 1 for a suitable time after stopping the supply of aluminum atoms onto the silicon substrate 1.

In such a manner, a preferable aluminum electrode film 11 having no void (air gap) can be obtained as shown in FIG. 1. Such a manufacturing method is especially effective in case that the width or the diameter of the contact hole 4 are as small as not more than 0.6 μm and the aspect ratio is as high as not less than 1.

The amount of silicon per unit cell C contained in the polysilicon film 15 (see FIG. 2(b) and FIG. 3) with respect to the amount of aluminum per unit cell C supplied to the silicon substrate 1 by sputtering method is not less than 0.1% and not more than 2% by atom ratio. Thereby, the abovementioned movement of aluminum atoms effectively occurs by diffusion, so that the contact hole 4 can be suitably filled with the aluminum electrode film 11. Further, formation of silicon nodules due to excessive silicon can be prevented.

Therefore, the aluminum electrode film 11 contains aluminum as the main component and a little amount (for example, 0.3% of aluminum by atomic ratio) of silicon.

Further, the ratio of the amount of silicon after etching to the amount of the aluminum supplied to the silicon substrate 1 is preferably within the solid solubility limit of silicon with respect to aluminum at the temperature used in the step of heating the silicon substrate 1. In this case, whole of silicon atoms constituting the polysilicon film 15 move into the aluminum thin film 16, and after completing the formation of the aluminum thin film 16, the polysilicon film 15 does not exist between the aluminum thin film 16 (aluminum electrode film 11) and the p$^+$-layer 10 and the stacked layer 3.

After the aluminum electrode film 11 is formed, unnecessary portions of the aluminum electrode film 11 are removed away by etching or the like.

Since the aluminum electrode film 11 contains silicon within the solid solubility limit, aluminum atoms constituting the aluminum electrode film 11 are hard to diffuse in the p$^+$-layer 10, the stacked layer 3, the epitaxial layer 2 and the like even if the silicon substrate 1 is heated to a high temperature at the time of forming the aluminum electrode film 11 by sputtering method or in any other step. Therefore, destruction of p-n junction by the diffusion of aluminum atoms into the epitaxial layer 2, the p$^-$-layer 5 and the n$^+$-layer 6 can be prevented. Further, in case of forming the aluminum electrode film 11 in such a manner, it is not necessary to form a barrier metal layer before forming the aluminum electrode film 11.

In the abovementioned method for manufacturing a semiconductor device, the area of the polysilicon film 15 after etching is, for example, nearly 10% of the area of aluminum thin film 16 (the area to which aluminum atoms are supplied). Therefore, the polysilicon film 15 can be formed to have a nearly ten-time thickness in comparison with the case that the polysilicon film 15 is formed substantially throughout the whole surface of the silicon substrate 1.

That is, when the polysilicon film 15 is formed substantially throughout the whole surface of the silicon substrate 1, the polysilicon film 15 has a thickness nearly 100 Å. In order to form such a thin polysilicon film 15, the amount of silicon supplied per unit area becomes small, and therefore the accuracy of the amount of silicon becomes low. On the other hand, by reducing the area of the polysilicon film 15 after etching as abovementioned, the amount of silicon supplied per unit area becomes large, and therefore the accuracy of the amount of silicon becomes high.

The abovementioned predetermined area in which the polysilicon film 15 remains on the silicon substrate 1 can be, for example, not more than 99% of the area of the aluminum thin film 16 (the area of the region on which the aluminum thin film 16 is formed on the semiconductor substrate 1 as a base) Since the aluminum thin film 16 in this embodiment is formed substantially throughout the whole surface of the silicon substrate 1, the ratio of the abovementioned predetermined area $S_p$ per unit cell C to the area $S_c$ of the silicon substrate 1 per unit cell C before forming the aluminum thin film 16 thereon can be not more than 99% (see FIG. 3).

Thereby, the accuracy of the amount of silicon in the polysilicon film 15 with respect to the amount of aluminum in the aluminum thin film 16 can become high.

Though one embodiment of the present invention has been explained as above, other embodiments of the present invention are possible. For example, a method for manufacturing a semiconductor device according to the present invention can be applied to cases of forming thin films by filling various contact holes of semiconductor devices other than a MOS FET.

For example, in the abovementioned embodiment, the aluminum electrode film 11 is electrically connected to the n$^+$-layer 6 (semiconductor layer) exposed to the side surface of the contact hole 4. However, the aluminum electrode film 11 may be formed so as to be electrically connected to a semiconductor layer (including the substrate itself) exposed to the bottom surface of the contact hole 4. In this case, only an insulator may be exposed to the inner side wall of the contact hole 4.

Further, the contact hole 4 is not limited to one for connecting a deriving electrode to a semiconductor layer (device) but may be one for effecting inter-layer connection of wirings (for example, metal wirings). In this case, the wirings are exposed to the inside (for example, the bottom surface) of the contact hole 4 and the aluminum electrode film 11 can be filled into the contact hole 4 by the same method as that of the above-mentioned embodiment.

Further, the aluminum electrode film 11 may be one electrically connected to a conductor exposed to the inside of the contact hole 4.

The contact hole into which a thin film (electrode wiring) is filled is not limited to one having a width or diameter not more than 0.6 µm but may have a width or diameter more than 0.6 µm. Furthermore, the contact hole into which a thin film (electrode wiring) is filled is not limited to one having an aspect ratio not less than 1 but may have an aspect ratio less than 1.

The semiconductor device may be another than a MOS FET such as IGBT (Insulated Gate Bipolar Transistor).

The process of heating the silicon substrate 1 may be separately carried out after completing the step of depositing aluminum atoms on the silicon substrate 1 (see FIG. 2(c))

Although the present invention has been described and illustrated in detail, it is clearly understood that the same is by way of illustration and example only and is not to be taken by way of limitation, the spirit and scope of the present invention being limited only by the terms of the appended claims.

This application corresponds to the Japanese Patent Application No.2003-51571 filed in the Japan Patent Office on Feb. 27, 2003, and the whole disclosure of the Japanese application is incorporated herein by reference.

What is claimed is:

1. A method for manufacturing a semiconductor device having a semiconductor substrate with a contact hole filled by an aluminum-containing thin film, comprising the steps of:
    forming a silicon-containing thin film in a region having a predetermined area including the inner surface of the contact hole on the surface of the semiconductor substrate;
    forming an aluminum-containing thin film on the surface of the semiconductor substrate on which the silicon-containing thin film is formed; and
    heating the semiconductor substrate on which the aluminum-containing thin film is formed to such a temperature as to cause silicon to diffuse with respect to aluminum;
    wherein the semiconductor substrate is provided with a plurality of cells each including the contact hole, and
    the ratio of the amount of silicon contained in the silicon-containing thin film formed in the region having the predetermined area per unit cell to the amount of aluminum supplied to a unit cell in the step of forming the aluminum thin film is not less than 0.1% and not more than 2% by atomic ratio.

2. A method for manufacturing a semiconductor device as claimed in claim 1, wherein the step of forming an aluminum-containing thin film and the step of heating the semiconductor substrate are carried out simultaneously.

3. A method for manufacturing a semiconductor device as claimed in claim 1, wherein the step of heating the semiconductor substrate is carried out after completing the step of forming the aluminum thin film.

4. A method for manufacturing a semiconductor device as claimed in claim 1, wherein the step of forming a silicon-containing thin film in the region having the predetermined area includes the steps of:
  forming a silicon-containing thin film in a region larger than the predetermined area; and
  removing the silicon-containing thin film so that the area of the silicon-containing thin film can become the abovementioned predetermined area.

5. A method for manufacturing a semiconductor device as claimed in claim 4, wherein the step of removing the silicon-containing thin film includes a step of removing the silicon-containing thin film using a mask having a predetermined pattern.

6. A method for manufacturing a semiconductor device as claimed in claim 4, wherein the step of removing the silicon-containing thin film includes a step of removing the silicon-containing thin film by etching.

7. A method for manufacturing a semiconductor device as claimed in claim 1, wherein the predetermined area is not more than 99% of the area of the aluminum-containing thin film formed in the step of forming the aluminum thin film.

8. A method for manufacturing a semiconductor device as claimed in claim 1, wherein the step of heating the semiconductor substrate includes a step of heating the semiconductor substrate to 380° C.~570° C.

* * * * *